(12) United States Patent
Umemoto

(10) Patent No.: US 7,061,735 B2
(45) Date of Patent: Jun. 13, 2006

(54) SEMICONDUCTOR DEVICE

(75) Inventor: Kiyotaka Umemoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 252 days.

(21) Appl. No.: 10/828,159

(22) Filed: Apr. 21, 2004

(65) Prior Publication Data

US 2004/0218323 A1 Nov. 4, 2004

(30) Foreign Application Priority Data

Apr. 30, 2003 (JP) ............................. 2003-124821

(51) Int. Cl.
*H02H 9/00* (2006.01)
(52) U.S. Cl. .......................................... 361/56; 326/15
(58) Field of Classification Search ................ 361/56; 326/15
See application file for complete search history.

(56) References Cited

U.S. PATENT DOCUMENTS 5,789,968 A * 8/1998 John ......................... 327/436
6,160,416 A * 12/2000 Adduci et al. ................. 326/21
6,480,038 B1 * 11/2002 Horn ............................ 327/66

FOREIGN PATENT DOCUMENTS

JP          7-42146        7/1995
JP         10-200056       7/1998

* cited by examiner

*Primary Examiner*—Phuong T. Vu
*Assistant Examiner*—Ann T. Hoang
(74) *Attorney, Agent, or Firm*—Arent Fox PLLC

(57) ABSTRACT

A semiconductor device has an electrostatic protection diode in a signal input portion thereof and is accompanied by a parasitic transistor between the diode and an output control transistor. The semiconductor device further has a dummy transistor that is formed closer than the output control transistor to the electrostatic protection diode, and an output logic determining circuit that keeps the output signal at a predetermined logic level so long as the parasitic transistor formed between the electrostatic protection diode and the dummy transistor is on. With this configuration, malfunctioning caused by a parasitic transistor can be prevented without the use of an externally fitted component.

8 Claims, 4 Drawing Sheets

SEMICONDUCTOR DEVICE

This application is based on Japanese Patent Application No. 2003-124821 filed on Apr. 30, 2003, the contents of which are hereby incorporated by reference.

BACKGROUND OF THE INVENTION

1. Field of the Invention

The present invention relates to a semiconductor device that has an electrostatic protection diode in a signal input portion and/or a signal output portion thereof and that is accompanied by a parasitic transistor between the electrostatic protection diode and an output control transistor.

2. Description of the Prior Art

A semiconductor device that has an electrostatic protection diode in a signal input/output portion thereof is, due to its own device structure, inevitably accompanied by a parasitic transistor between the electrostatic protection diode and an output control transistor. Accordingly, in a semiconductor device having such a structure, if the parasitic transistor turns on for some cause (for example, application of an excessively high positive or negative voltage to a signal input terminal), an unintended level shift may occur in the output signal, causing inconsistency between the logic levels of the input and output signals.

The conditions under which the parasitic transistor turns on vary according to many factors such as the distance from the electrostatic protection diode to the output control transistor and the concentrations of the diffusion layers of which the individual circuit elements are formed. This makes it difficult to predict such conditions. For this reason, to overcome the above-mentioned problem, conventionally, when a semiconductor device is mounted on a circuit board, at a signal input terminal thereof is externally fitted a diode (such as a Shottky diode) of which the pn forward voltage drop VF is smaller than that of the electrostatic protection diode or that of the parasitic transistor, or alternatively a current-limiting resistor. On the other hand, the semiconductor device itself is not specially designed to cope with malfunctioning caused by the parasitic transistor, and simply its technical data includes a warning against application of an excessively high voltage or a permissible input voltage range (for example, −0.3 [V] or higher).

It is true that, even though a semiconductor device itself is not specially designed to cope with such a problem, it is possible to prevent inconsistency in the input/output logic level thereof by taking the above-mentioned measures (externally fitting a Shottky diode or a current-limiting resistor) when the semiconductor device is mounted on a circuit board, because doing so makes it difficult for the parasitic transistor to turn on.

However, taking the above-mentioned measures results in, on the side of the user of the semiconductor device, an increased number of externally fitted components, an accordingly more complicated fabrication process, a higher cost, a larger device scale, etc. Thus, the users of semiconductor devices have been strongly desiring that the semiconductor devices themselves be designed to cope with parasitic transistors.

In response to such demands, recent years have been increasingly witnessing disclosures of and proposals for semiconductor devices that are designed to cope with parasitic transistors. For example, Japanese Patent Application Laid-Open No. H10-200056 discloses a semiconductor integrated circuit device provided with a negative voltage detection circuit wherein, according to the detection signal from that circuit, the load is disconnected or the output transistor is controlled so as to prevent malfunctioning or device breakdown caused by application of a negative voltage. On the other hand, Japanese Utility Model Laid-Open No. H7-42146 discloses a bipolar IC wherein, instead of an electrostatic protection diode, a diode-connected transistor is used to prevent the parasitic transistor from turning on.

SUMMARY OF THE INVENTION

An object of the present invention is to provide a semiconductor device that, without requiring an externally fitted component, can prevent malfunctioning caused by a parasitic transistor.

To achieve the above object, according to the present invention, a semiconductor device is provided with: an output control transistor that shifts the logic level of an output signal according to an input signal; an electrostatic protection diode that protects the output control transistor from electrostatic breakdown; a dummy transistor that is formed closer than the output control transistor to the electrostatic protection diode; and an output logic determining circuit that keeps the output signal at a predetermined logic level irrespective of whether the output control transistor is on or off so long as a parasitic transistor formed between the electrostatic protection diode and the dummy transistor is on.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figures 1A, 1B:
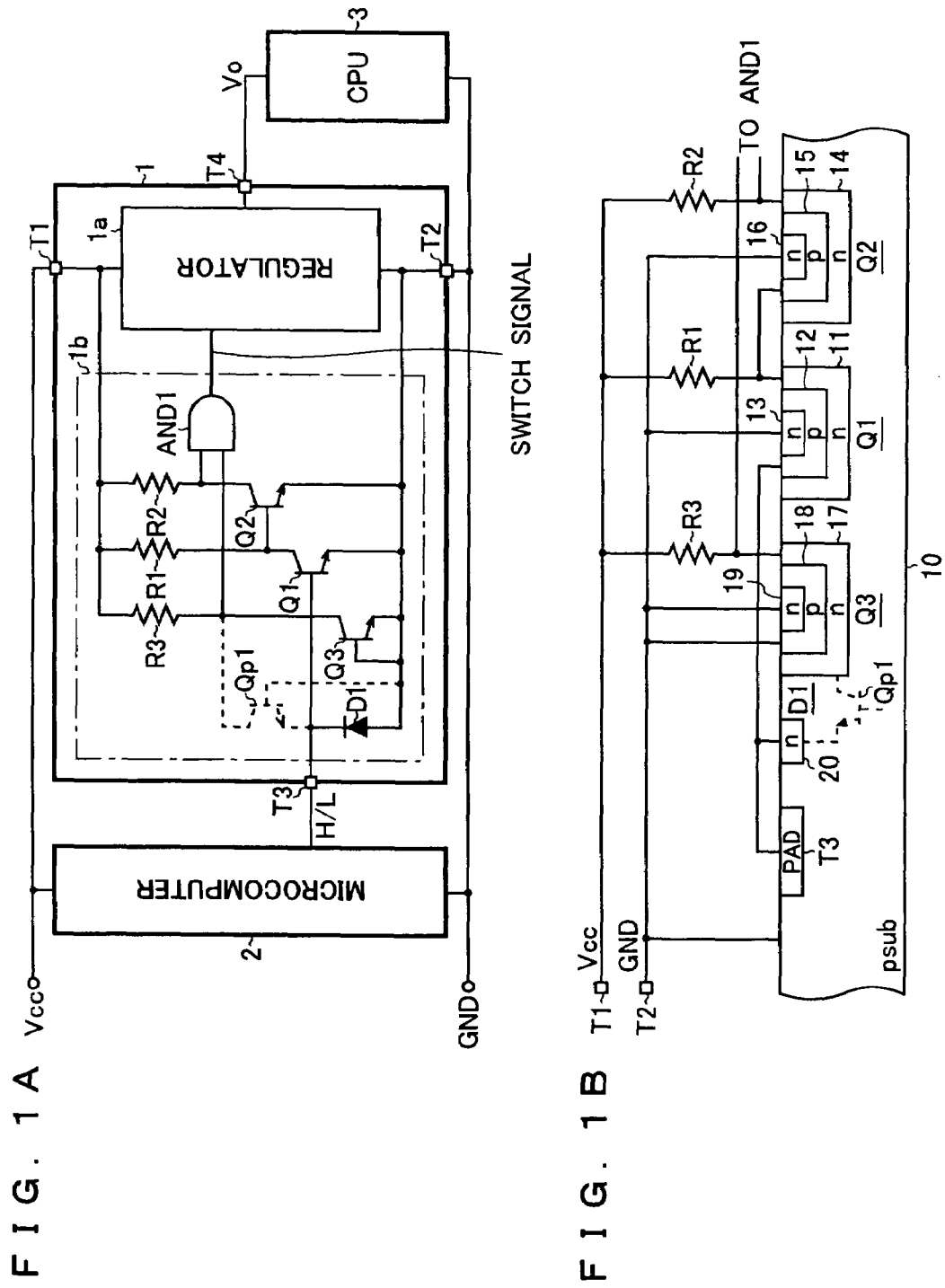
FIGS. 1A and 1B are diagrams showing the power supply IC incorporating a switch according to a first embodiment of the invention.

Hereinafter, embodiments of the present invention will be described, taking up examples in which it is applied to a power supply IC incorporating a switch. FIGS. 1A and 1B are diagrams showing a first embodiment of eh invention. FIG. 1A is a block diagram (partially a circuit diagram) showing the configuration of a principal portion of the IC, and FIG. 1B is a vertical sectional view showing the device structure thereof.

As shown in FIG. 1A, the power supply IC 1 incorporating a switch according to this embodiment includes: a power terminal T1 to which a supply voltage Vcc is applied; a ground terminal T2 to which a ground potential GND is applied; a signal input terminal T3 via which a logic signal (taking either a high (H) level or a low (L) level at a time) from a microcomputer 2 is fed in; a voltage output terminal T4 via which a predetermined voltage Vo is fed out to a CPU (central processing unit) 3; a regulator portion 1a of which the operation is turned on and off according to a switch signal and that generates from the supply voltage Vcc the predetermined voltage Vo and feeds it to the CPU 3; and a switch portion 1*b* that feeds the regulator portion 1*a* with, as the switch signal, the logic signal fed in from the microcomputer 2.

The switch portion 1*b* includes npn-type bipolar transistors Q1 to Q3 (two output control transistors Q1 and Q2 and a dummy transistor Q3), resistors R1 to R3, an electrostatic protection diode D1, and an AND circuit AND1. As shown in FIG. 1B, these circuit elements are formed on a p-type semiconductor substrate 10 in the following order: the signal input terminal T3, then the electrostatic protection diode D1, then the transistor Q3, then the transistor Q1, and then the transistor Q2.

The base (a p-type semiconductor region 12) of the transistor Q1 is connected to the signal input terminal T3. The collector (an n-type semiconductor region 11) of the transistor Q1 is connected through the resistor R1 to the power terminal T1, and is also connected to the base (a p-type semiconductor region 15) of the transistor Q2. The emitter (an n-type semiconductor region 13) of the transistor Q1 is connected to the ground terminal T2.

The collector (an n-type semiconductor region 14) of the transistor Q2 is connected through the resistor R2 to the power terminal T1, and is also connected to the first input terminal of the AND circuit AND1. The emitter (an n-type semiconductor region 16) of the transistor Q2 is connected to the ground terminal T2.

The collector (an n-type semiconductor region 17) of the transistor Q3 is connected through the resistor R3 to the power terminal T1, and is also connected to the second input terminal of the AND circuit AND1. The base (a p-type semiconductor region 18) and emitter (an n-type semiconductor region 19) of the transistor Q3 are both connected to the ground terminal T2.

The cathode (an n-type semiconductor region 20) of the electrostatic protection diode D1 is connected to the signal input terminal T3. The anode (a p-type semiconductor substrate 10) of the electrostatic protection diode D1 is connected to the ground terminal T2.

The output terminal of the AND circuit AND1, which serves as the output terminal of the switch portion 1*b*, is connected to the operation enable/disable control terminal of the switch portion 1*b*.

In the switch portion 1*b* structured as described above, between the electrostatic protection diode D1 and the transistor Q3, there is formed a parasitic transistor Qp2 that has its base at the p-type semiconductor substrate 10, has its emitter at the n-type semiconductor region 20, and has its collector at the n-type semiconductor region 17. Likewise, between the electrostatic protection diode D1 and the transistors Q1 and Q2, there are also formed, though not illustrated, parasitic transistors that have their collectors at the n-type semiconductor regions 11 and 14, respectively.

Figure 2A:
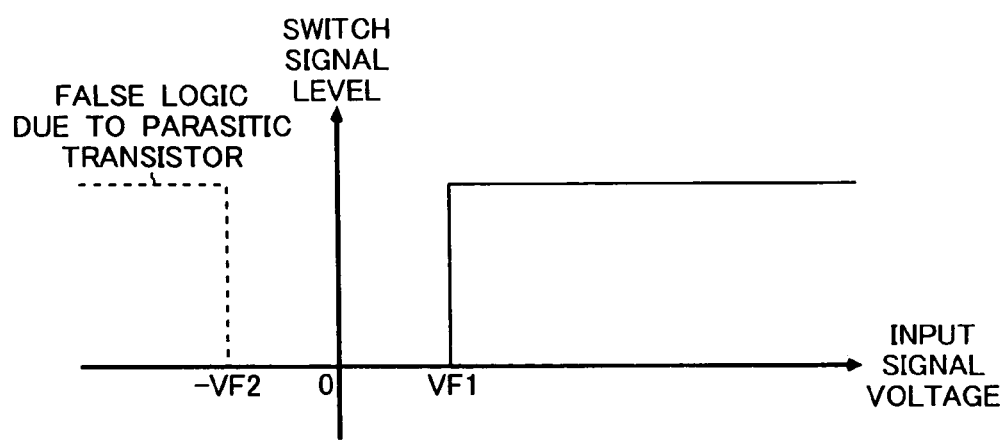
FIGS. 2A and 2B are diagrams illustrating the signal input/output operation of the switch portion 1b.
Figure 2B:
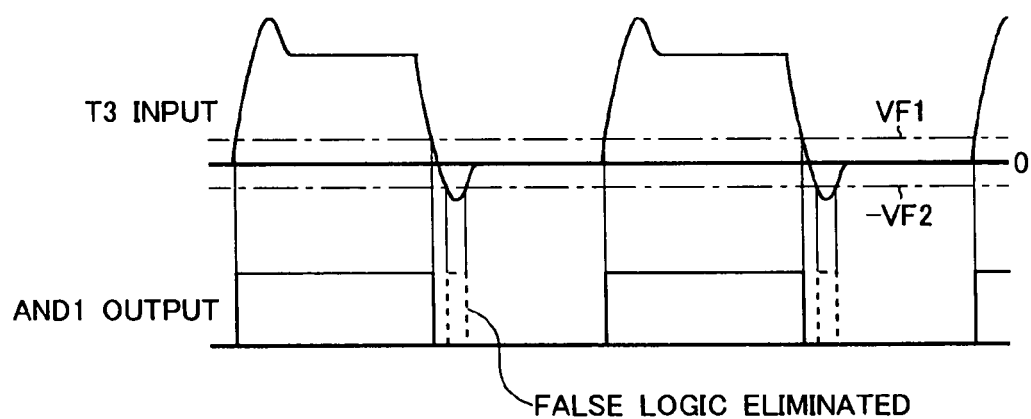

Next, with reference to FIGS. 2A and 2B, a description will be given of the signal input/output operation of the switch portion 1*b* configured as described above. FIG. 2A shows how the logic level of the switch signal shifts according to the input signal, and FIG. 2B shows the waveforms of the input signal and of the switch signal.

When no excessively high negative voltage is applied to the signal input terminal T3, and thus the input signal is within a predetermined voltage range (equal to or higher than −VF2), the base-emitter voltage of the parasitic transistor Qp2 never becomes higher than the turn-on voltage VF2 thereof, and thus the parasitic transistor Qp2 remains off. Accordingly, the parasitic transistor Qp2 never causes the collector voltage of the transistor Q3 (which remains off) to fall, and thus the second input logic level of the AND circuit AND1 remains high. That is, when the voltage level of the input signal is normal, the output logic level of the AND circuit AND1 is equal to the first input logic level thereof (i.e., the collector voltage of the transistor Q2).

In the above-described state in which the input signal is normal, when the input signal to the signal input terminal T3 turns high, the base-emitter voltage of the transistor Q1 becomes higher than the turn-on voltage VF1 thereof, and thus the transistor Q1 turns on. This causes the collector voltage of the transistor Q1 to fall. As a result, the base-emitter voltage of the transistor Q2 becomes lower than the turn-on voltage VF1 thereof, and thus the transistor Q2 turns off. Accordingly, the collector voltage of the transistor Q2 rises, so that the first input logic level of the AND circuit AND1 (i.e., the output logic level thereof) is high, which is consistent with the logic level of the input signal.

On the other hand, when the input signal to the signal input terminal T3 turns low, the base-emitter voltage of the transistor Q1 becomes lower than the turn-on voltage VF1 thereof, and thus the transistor Q1 turns off. This causes the collector voltage of the transistor Q1 to rise. As a result, the base-emitter voltage of the transistor Q2 becomes higher than the turn-on voltage VF1 thereof, and thus the transistor Q2 turns on. Accordingly, the collector voltage of the transistor Q2 falls, so that the first input logic level of the AND circuit AND1 (i.e., the output logic level thereof) is low, which is consistent with the logic level of the input signal.

Next, a description will be given of what happens when an excessively high negative voltage is applied to the signal input terminal T3, and thus the input signal becomes lower than −VF2 (as when an undershoot occurs in the input signal to the signal input terminal T3). In this case, in a conventional configuration (which lacks the transistor Q3), the parasitic transistor formed between the electrostatic protection diode D1 and the transistor Q1 turns on, and thus this parasitic transistor causes the collector voltage of the transistor Q1 to fall. As a result, the transistor Q2 turns off, and thus, even though the input signal is low, a high level is outputted as the switch signal, causing malfunctioning of the CPU 3, i.e., causing it to operate when it should not (as indicated by broken lines in FIGS. 2A and 2B).

By contrast, in the switch portion 1*b* according to this embodiment, in the case described above, of all the parasitic transistors formed between the electrostatic protection diode D1 and the transistors Q1 to Q3, the one Qp1 that accompanies the transistor Q3, the closest to the electrostatic protection diode D1, turns on first. Thus, this parasitic transistor Qp1 causes the collector voltage of the transistor Q3 (which remains off) to fall, and thereby causes the second input logic level to the AND circuit AND1 to turn low. Consequently, irrespective of the first input logic level of the AND circuit AND1 (i.e., the collector voltage of the transistor Q2), the output logic level of the AND circuit AND1 is low, which is consistent with the logic level of the input signal. With this configuration, it is possible to prevent malfunctioning caused by a parasitic transistor without the use of an externally fitted component such as a Shottky diode or current-limiting resistor.

It is preferable that the resistor R3 be given a resistance equal to or higher than the resistance of the resistors R1 and R2. Setting the resistances in this way makes it possible to more surely turn the parasitic transistor Qp1 on earlier than the other parasitic transistors.

Next, with reference to FIGS. 3A and 3B, a second embodiment of the invention will be described in detail.

Figures 3A, 3B:
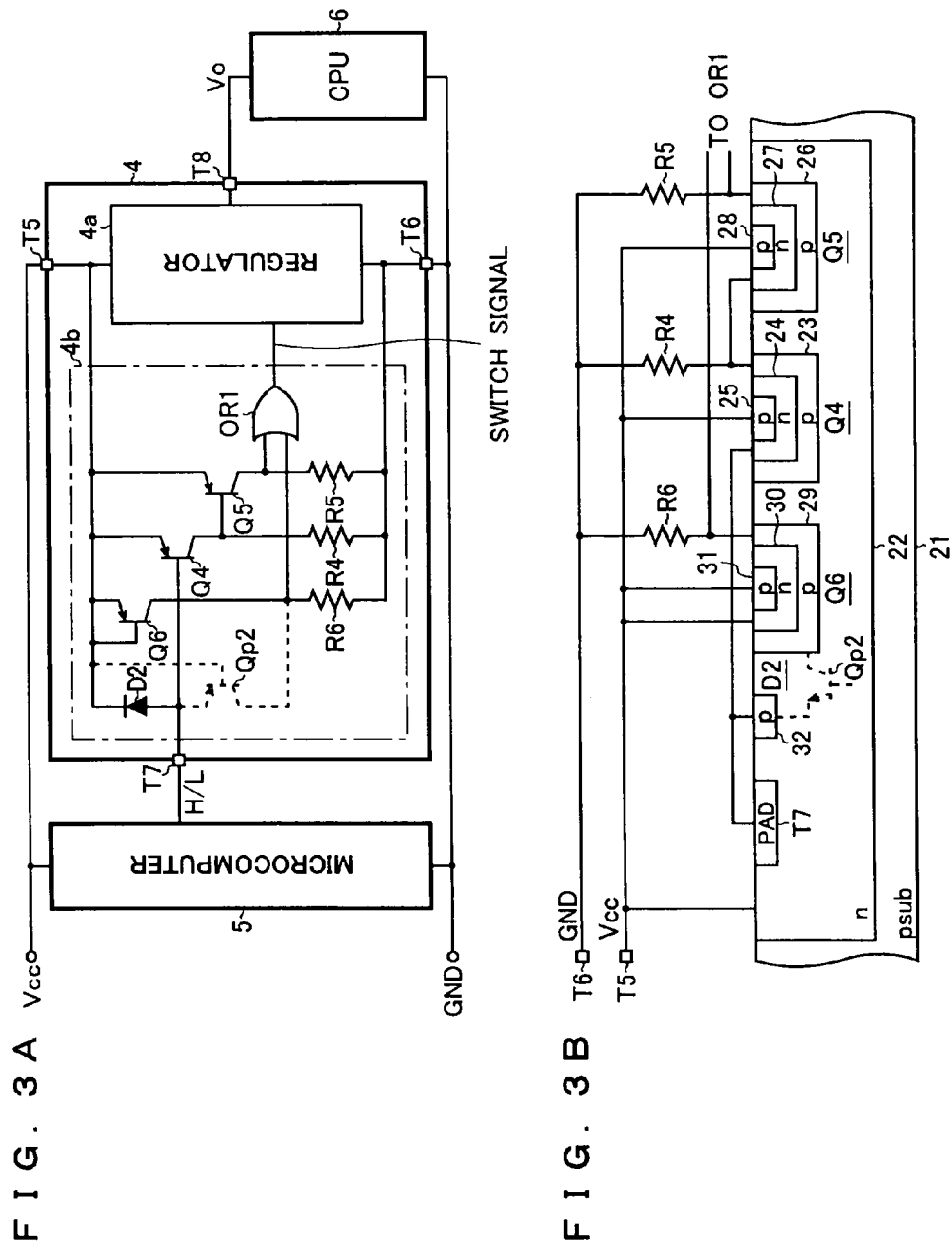
FIGS. 3A and 3B are diagrams showing the power supply IC incorporating a switch according to a second embodiment of the invention.

FIG. 3A is a block diagram (partially a circuit diagram) showing the configuration of a principal portion of the IC, and FIG. 3B is a vertical sectional view showing the device structure thereof.

As shown in FIG. 3A, the power supply IC 4 incorporating a switch according to this embodiment includes: a power terminal T5 to which a supply voltage Vcc is applied; a ground terminal T6 to which a ground potential GND is applied; a signal input terminal T7 via which a logic signal (taking either a high (H) level or a low (L) level at a time) from a microcomputer 5 is fed in; a voltage output terminal T8 via which a predetermined voltage Vo is fed out to a CPU 6; a regulator portion 4a of which the operation is turned on and off according to a switch signal and that generates from the supply voltage Vcc the predetermined voltage Vo and feeds it to the CPU 6; and a switch portion 4b that feeds the regulator portion 4a with, as the switch signal, the logic signal fed in from the microcomputer 5.

The switch portion 4b includes pnp-type bipolar transistors Q4 to Q6 (two output control transistors Q4 and Q5 and a dummy transistor Q6), resistors R4 to R6, an electrostatic protection diode D2, and an OR circuit OR1. As shown in FIG. 3B, these circuit elements are formed on an n-type semiconductor region 22 formed on a p-type semiconductor substrate 21 in the following order: the signal input terminal T7, then the electrostatic protection diode D2, then the transistor Q6, then the transistor Q4, and then the transistor Q5.

The base (an n-type semiconductor region 24) of the transistor Q4 is connected to the signal input terminal T7. The collector (an n-type semiconductor region 23) of the transistor Q4 is connected through the resistor R4 to the ground terminal T6, and is also connected to the base (an n-type semiconductor region 27) of the transistor Q5. The emitter (a p-type semiconductor region 25) of the transistor Q4 is connected to the power terminal T5.

The collector (a p-type semiconductor region 26) of the transistor Q5 is connected through the resistor R5 to the ground terminal T6, and is also connected to the first input terminal of the OR circuit OR1. The emitter (a p-type semiconductor region 28) of the transistor Q5 is connected to the power terminal T5.

The collector (a p-type semiconductor region 29) of the transistor Q6 is connected through the resistor R6 to the ground terminal T6, and is also connected to the second input terminal of the OR circuit OR1. The base (an n-type semiconductor region 30) and emitter (a p-type semiconductor region 31) of the transistor Q6 are both connected to the power terminal T5.

The cathode (an n-type semiconductor region 22) of the electrostatic protection diode D2 is connected to the power terminal T5. The anode (a p-type semiconductor substrate 32) of the electrostatic protection diode D2 is connected to the signal input terminal T7.

The output terminal of the OR circuit OR1, which serves as the output terminal of the switch portion 4b, is connected to the operation enable/disable control terminal of the switch portion 4b.

In the switch portion 4b structured as described above, between the electrostatic protection diode D2 and the transistor Q6, there is formed a parasitic transistor Qp2 that has its base at the n-type semiconductor substrate 22, has its emitter at the p-type semiconductor region 32, and has its collector at the p-type semiconductor region 29. Likewise, between the electrostatic protection diode D2 and the transistors Q4 and Q5, there are also formed, though not illustrated, parasitic transistors that have their collectors at the p-type semiconductor regions 23 and 26, respectively.

Figure 4A:
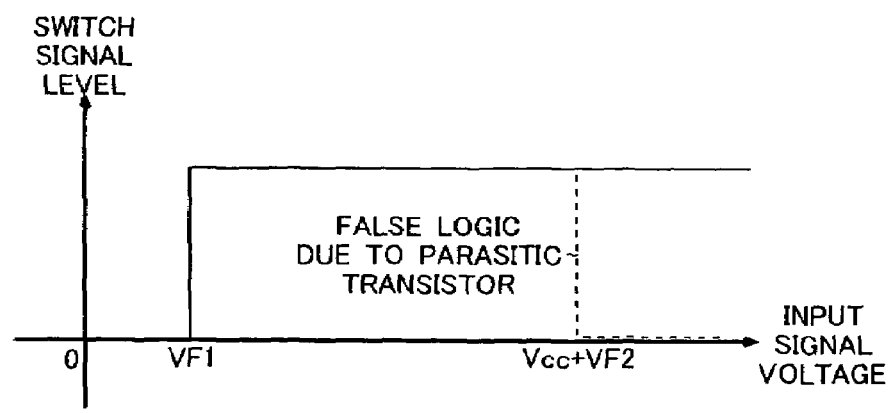
FIGS. 4A and 4B are diagrams illustrating the signal input/output operation of the switch portion 4b.
Figure 4B:
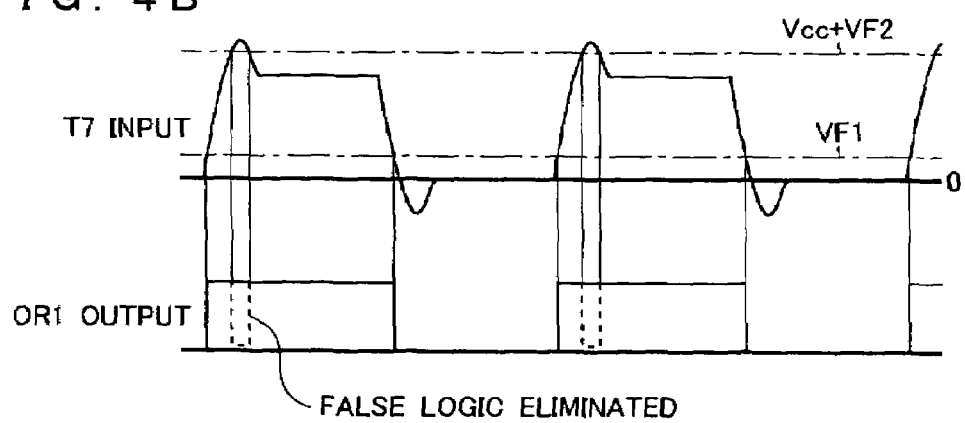

Next, with reference to FIGS. 4A and 4B, a description will be given of the signal input/output operation of the switch portion 4b configured as described above. FIG. 4A shows how the logic level of the switch signal shifts according to the input signal, and FIG. 4B shows the waveforms of the input signal and of the switch signal.

When no excessively high positive voltage is applied to the signal input terminal T7, and thus the input signal is within a predetermined voltage range (equal to or lower than Vcc+VF2), the base-emitter voltage of the parasitic transistor Qp2 never becomes higher than the turn-on voltage VF2 thereof, and thus the parasitic transistor Qp2 remains off. Accordingly, the parasitic transistor Qp2 never causes the collector voltage of the transistor Q6 (which remains off) to rise, and thus the second input logic level of the OR circuit OR1 remains low. That is, when the voltage level of the input signal is normal, the output logic level of the OR circuit OR1 is equal to the first input logic level thereof (i.e., the collector voltage of the transistor Q5).

In the above-described state in which the input signal is normal, when the input signal to the signal input terminal T7 turns high, the base-emitter voltage of the transistor Q4 becomes lower than the turn-on voltage VF1 thereof, and thus the transistor Q4 turns off. This causes the collector voltage of the transistor Q4 to fall. As a result, the base-emitter voltage of the transistor Q5 becomes higher than the turn-on voltage VF1 thereof, and thus the transistor Q5 turns on. Accordingly, the collector voltage of the transistor Q5 rises, so that the first input logic level of the OR circuit OR1 (i.e., the output logic level thereof) is high, which is consistent with the logic level of the input signal.

On the other hand, when the input signal to the signal input terminal T7 turns low, the base-emitter voltage of the transistor Q4 becomes higher than the turn-on voltage VF1 thereof, and thus the transistor Q4 turns on. This causes the collector voltage of the transistor Q4 to rise. As a result, the base-emitter voltage of the transistor Q5 becomes lower than the turn-on voltage VF1 thereof, and thus the transistor Q5 turns off. Accordingly, the collector voltage of the transistor Q5 falls, so that the first input logic level of the OR circuit OR1 (i.e., the output logic level thereof) is low, which is consistent with the logic level of the input signal.

Next, a description will be given of what happens when an excessively high positive voltage is applied to the signal input terminal T7, and thus the input signal becomes higher than Vcc+VF2 (as when an overshoot occurs in the input signal to the signal input terminal T7). In this case, in a conventional configuration (which lacks the transistor Q6), the parasitic transistor formed between the electrostatic protection diode D2 and the transistor Q4 turns on, and thus this parasitic transistor causes the collector voltage of the transistor Q4 to rise. As a result, the transistor Q5 turns off, and thus, even though the input signal is high, a low level is outputted as the switch signal, causing malfunctioning of the CPU 6, i.e., disabling it from operating when it should operate (as indicated by broken lines in FIGS. 4A and 4B).

By contrast, in the switch portion 4b according to this embodiment, in the case described above, of all the parasitic transistors formed between the electrostatic protection diode D2 and the transistors Q4 to Q6, the one Qp2 that accompanies the transistor Q6, the closest to the electrostatic protection diode D2, turns on first. Thus, this parasitic transistor Qp2 causes the collector voltage of the transistor Q6 (which remains off) to rise, and thereby causes the second input logic level to the OR circuit OR1 to turn high.

Consequently, irrespective of the first input logic level of the OR circuit OR1 (i.e., the collector voltage of the transistor Q5), the output logic level of the OR circuit OR1 is high, which is consistent with the logic level of the input signal. With this configuration, it is possible to prevent malfunctioning caused by a parasitic transistor without the use of an externally fitted component such as a Shottky diode or current-limiting resistor.

It is preferable that the resistor R6 be given a resistance equal to or higher than the resistance of the resistors R4 and R5. Setting the resistances in this way makes it possible to more surely turn the parasitic transistor Qp2 on earlier than the other parasitic transistors.

The embodiments described above deal with cases in which the present invention is applied to the signal input portion of a power supply IC incorporating a switch. It is, however, to be understood that the present invention can be applied to any other target than specifically described above. That is, the present invention can be applied widely to semiconductor devices in general that have an electrostatic protection diode in a signal input portion and/or a signal output portion thereof and are accompanied by a parasitic transistor between the electrostatic protection diode and an output control transistor.

The embodiments described above deal with cases in which bipolar transistors are used. It is, however, to be understood that the present invention can be applied to any other configuration than specifically described above. For example, field-effect transistors may be used instead to obtain similar advantages.

As described above, according to the present invention, a semiconductor device that has an electrostatic protection diode in a signal input portion and/or a signal output portion thereof and that is accompanied by a parasitic transistor between the electrostatic protection diode and an output control transistor is further provided with a dummy transistor that is formed closer than the output control transistor to the electrostatic protection diode and an output logic determining circuit that keeps the output signal at a predetermined logic level so long as the parasitic transistor formed between the electrostatic protection diode and the dummy transistor is on.

More specifically, according to the present invention, a semiconductor device is provided with: an electrostatic protection diode that has the cathode thereof connected to a signal input terminal and has the anode thereof connected to a ground terminal; a first output control transistor of an npn type that has the base thereof connected to the signal input terminal, has the collector thereof connected through a first resistor to a supply power terminal, and has the emitter thereof connected to the ground terminal; a second output control transistor of an npn type that has the base thereof connected to the node between the collector of the first output control transistor and the first resistor, has the collector thereof connected through a second resistor to the supply power terminal, and has the emitter thereof connected to the ground terminal; a dummy transistor of an npn type that is formed closer than the output control transistors to the electrostatic protection diode, has the collector thereof connected through a third resistor to the supply power terminal, and has the base and emitter thereof both connected to the ground terminal; and an AND circuit that has the first input terminal thereof connected to the node between the collector of the second output control transistor and the second transistor and has the second input terminal thereof connected to the node between the collector of the dummy transistor and the third transistor.

Alternatively, according to the present invention, a semiconductor device is provided with: an electrostatic protection diode that has the anode thereof connected to a signal input terminal and has the cathode thereof connected to a supply power terminal; a first output control transistor of a pnp type that has the base thereof connected to the signal input terminal, has the collector thereof connected through a first resistor to a ground terminal, and has the emitter thereof connected to the supply power terminal; a second output control transistor of a pnp type that has the base thereof connected to the node between the collector of the first output control transistor and the first resistor, has the collector thereof connected through a second resistor to the ground terminal, and has the emitter thereof connected to the supply power terminal; a dummy transistor of a pnp type that is formed closer than the output control transistors to the electrostatic protection diode, has the collector thereof connected through a third resistor to the ground terminal, and has the base and emitter thereof both connected to the supply power terminal; and an OR circuit that has the first input terminal thereof connected to the node between the collector of the second output control transistor and the second transistor and has the second input terminal thereof connected to the node between the collector of the dummy transistor and the third transistor.

With this configuration, it is possible to prevent malfunctioning caused by a parasitic transistor without the use of an externally fitted component.

In a semiconductor device configured as described above, it is preferable that the third resistor be given a resistance equal to or higher than the resistance of the first and second resistors. Setting the resistances in this way makes it possible to more surely turn on the parasitic transistor that accompanies the dummy transistor earlier than the other parasitic transistors.

What is claimed is:

1. A semiconductor device comprising:
    an output control transistor that shifts a logic level of an output signal according to an input signal;
    an electrostatic protection diode that protects the output control transistor from electrostatic breakdown;
    a dummy transistor that is formed closer than the output control transistor to the electrostatic protection diode; and
    an output logic determining circuit that keeps the output signal at a predetermined logic level irrespective of whether the output control transistor is on or off so long as a parasitic transistor formed between the electrostatic protection diode and the dummy transistor is on.

2. A semiconductor device comprising:
    an electrostatic protection diode that has a cathode thereof connected to a signal input terminal and has an anode thereof connected to a ground terminal;
    a first transistor of an npn type that has a base thereof connected to the signal input terminal, has a collector thereof connected through a first resistor to a supply power terminal, and has an emitter thereof connected to the ground terminal;
    a second transistor of an npn type that has a base thereof connected to a node between the collector of the first transistor and the first resistor, has a collector thereof connected through a second resistor to the supply power terminal, and has an emitter thereof connected to the ground terminal;
    a third transistor of an npn type that is formed closer than the first and second transistors to the electrostatic protection diode, has a collector thereof connected through a third resistor to the supply power terminal, and has a base and an emitter thereof both connected to the ground terminal; and an AND circuit that has a first input terminal thereof connected to a node between the collector of the second resistor and the second transistor and has a second input terminal thereof connected to a node between the collector of the third resistor and the third transistor.

3. A semiconductor device as claimed in claim 2, wherein the third resistor has a resistance equal to or higher than resistances of the first and second resistors.

4. A semiconductor device comprising:

an electrostatic protection diode that has an anode thereof connected to a signal input terminal and has a cathode thereof connected to a supply power terminal;

a first transistor of a pnp type that has a base thereof connected to the signal input terminal, has a collector thereof connected through a first resistor to a ground terminal, and has an emitter thereof connected to the supply power terminal;

a second transistor of a pnp type that has a base thereof connected to a node between the collector of the first transistor and the first resistor, has a collector thereof connected through a second resistor to the ground terminal, and has an emitter thereof connected to the supply power terminal;

a third transistor of a pnp type that is formed closer than the first and second transistors to the electrostatic protection diode, has a collector thereof connected through a third resistor to the ground terminal, and has a base and an emitter thereof both connected to the supply power terminal; and an OR circuit that has a first input terminal thereof connected to a node between the collector of the second resistor and the second transistor and has a second input terminal thereof connected to a node between the collector of the third resistor and the third transistor.

5. A semiconductor device as claimed in claim 4, wherein the third resistor has a resistance equal to or higher than resistances of the first and second resistors.

6. A semiconductor device comprising:

a first transistor that shifts a logic level of a signal according to an input signal;

an electrostatic protection diode that protects the first transistor from electrostatic breakdown;

a second transistor that is formed closer than the first transistor to the electrostatic protection diode; and an output logic determining circuit that outputs a predetermined logic level irrespective of whether the first transistor is on or off so long as a parasitic transistor formed between the electrostatic protection diode and the second transistor is on.

7. A semiconductor device as claimed in claim 6, wherein the second transistor is a dummy transistor that does not operate during normal operation.

8. A semiconductor device as claimed in claim 6, wherein the output logic determining circuit controls the first transistor.

* * * * *